United States Patent
Wang

(10) Patent No.: US 8,095,856 B2
(45) Date of Patent: Jan. 10, 2012

(54) METHOD AND APPARATUS FOR MITIGATING MEMORY REQUIREMENTS OF ERASURE DECODING PROCESSING

(75) Inventor: Hung-Hsiang Wang, Jhudong Township (TW)

(73) Assignee: Industrial Technology Research Institute (TW)

( * ) Notice: Subject to any disclaimer, the term of this patent is extended or adjusted under 35 U.S.C. 154(b) by 1121 days.

(21) Appl. No.: 11/855,905

(22) Filed: Sep. 14, 2007

(65) Prior Publication Data

US 2009/0077454 A1 Mar. 19, 2009

(51) Int. Cl.
*H03M 13/00* (2006.01)
*G06F 11/10* (2006.01)
*G01R 31/28* (2006.01)

(52) U.S. Cl. ......... 714/784; 714/736; 714/785; 714/807

(58) Field of Classification Search .......... 714/736, 714/776, 785, 781, 758, 759, 790, 799, 807, 714/718, 805, 784, 795
See application file for complete search history.

(56) References Cited

U.S. PATENT DOCUMENTS

| | | | |
|---|---|---|---|
| 5,673,363 A | 9/1997 | Jeon et al. | |
| 6,351,730 B2 | 2/2002 | Chen | |
| 6,516,430 B1 * | 2/2003 | Ogura et al. | 714/719 |
| 6,687,670 B2 | 2/2004 | Sydanmaa et al. | |
| 6,826,441 B2 * | 11/2004 | Yamagishi | 700/121 |
| 6,986,092 B2 | 1/2006 | Butler et al. | |
| 7,167,405 B1 * | 1/2007 | Wong et al. | 365/201 |
| 7,233,897 B2 | 6/2007 | Kapilow | |
| 7,376,872 B1 * | 5/2008 | Nelson et al. | 714/718 |
| 7,756,132 B2 * | 7/2010 | Copps | 370/392 |
| 7,848,232 B2 * | 12/2010 | Loffink et al. | 370/230 |
| 2005/0229070 A1 | 10/2005 | Okamoto et al. | |
| 2007/0038921 A1 * | 2/2007 | Pekonen et al. | 714/776 |
| 2009/0055715 A1 * | 2/2009 | Jashek et al. | 714/776 |

FOREIGN PATENT DOCUMENTS

| | | |
|---|---|---|
| CN | 1677874 A | 10/2005 |
| TW | 200718074 | 6/1995 |
| TW | 200714083 | 7/1995 |

OTHER PUBLICATIONS

Office Action for Chinese Application No. 2007/10160550X, mailed Dec. 4, 2009, no English translation.
Office Action for Taiwanese Application No. 096139029, mailed Jul. 12, 2011.

* cited by examiner

*Primary Examiner* — Phung M Chung
(74) *Attorney, Agent, or Firm* — Alston & Bird LLP

(57) ABSTRACT

A system and method corrects erroneous sections received in a memory by pre-filling at least a portion of memory with a pre-defined value. If a received data packet is valid, the valid received data packet is stored over the pre-defined values in the memory location associated with the valid data packet. Values associated with a data segment and an adjacent data segment in the memory are compared to the pre-defined value. When the values of each data segment match the pre-defined values, then each data segment is an erroneous data segment.

14 Claims, 12 Drawing Sheets

FIG. 1B
(PRIOR ART)

Erasure Structure List — 160

| Address [A] | Size [S] |
|---|---|
| B13:150 | 12 |
| B15:450 | 5 |
| B16:620 | 22 |
| B19:921 | 50 |
| ⋮ | ⋮ |

FIG. 1C
(PRIOR ART)

METHOD AND APPARATUS FOR MITIGATING MEMORY REQUIREMENTS OF ERASURE DECODING PROCESSING

TECHNICAL FIELD

The present application generally relates to systems and methods of data communication between devices.

BACKGROUND

There are types of transmission errors that can occur during the data transmission, such as noise, interference, etc. Forward Error Correction (FEC) has been widely used in overcome transmission errors in digital wireless communication systems, mass digital storage systems, etc.

In a digital video broadcast (DVB) system, video source information received from an external source is transmitted from a transmitter to a receiver. Multi-protocol encapsulation forward error correction (MPE-FEC) provides an additional layer of an error correction. The MPE-FEC scheme is based on a Reed-Solomon (RS) code. In the digital video broadcast system, the contents to be transmitted and encapsulated come in the form of Internet Protocol (IP) datagrams or other network datagrams. With Multi-protocol encapsulation techniques used in data transmission, each IP datagram is encapsulated into one MPE-Application (AP) data section. The RS parity data, calculated from the MPE-AP datagrams, are encapsulated into MPE-RS data sections. By adding RS parity data information and sending this parity data in separate sections, error free datagrams can be output even under bad reception conditions. MPE-AP data and MPE-RS data sections are protected by a cyclic redundancy check (CRC) or a check sum, which reliably detects all erroneous sections. Accordingly, if the CRC check fails, the receiver may flag the erroneous sections as unreliable and allow the Reed-Solomon (RS) decoder to correct the errors in the MPE-FEC table. On the other hand, the receiver may put each correctly received section in the right place in the MPE-FEC table, provided the CRC shows that the received section is correct.

In order for a RS decoder in a receiver to correct erroneous data packets, conventionally, corresponding flags are stored in an additional memory. For example, FIGS. 1A and 1B illustrate a method of error correction of the prior art. An additional memory as shown in FIG. 1B, with the size as large as the MPE-FEC frame as illustrated in FIG. 1A, is used to store flags associated with every byte of the sections marked as reliable and unreliable. Referring to FIG. 1A, each byte of either the reliable sections 110 or the unreliable sections 120 of the MPE-FEC frame 105 is assigned a corresponding flag. These corresponding flags are all stored in an additional memory 150 with reference to FIG. 1B.

In another method as illustrated in FIG. 1C, an additional memory, which is an erasure structure list table in a receiver, is required to store the information associated with the detected erroneous sections. Referring to FIG. 1C, a column 162 of a table 160 indicates the start address of the first byte of each erroneous section and a column 164 of the table 160 denotes the byte-wise length, or size of that corresponding erroneous section. For example, a row 166 shows that an erroneous section starts from the address B16: 620 and the length of that erroneous section is 22 bytes. If the Address column 162 takes m bits, and the Size column 164 takes n bits, the total memory required for the erasure structure list table may take 64×(m+n) bits in an example that the decoder is able to correct up to 64 erasures per 255-byte.

BRIEF SUMMARY

According to one embodiment of the invention, a method for erasure error correction processing comprises pre-filling at least a portion of a memory with a pre-defined value. Next, if a received data packet is valid, the valid received data packet is stored in the memory location associated with the valid received data packet, and then the values associated with a data segment and an adjacent data segment in the memory is compared to the pre-defined value. When the values of each data segment match the pre-defined values, the each data segment is an erroneous data segment.

According to another embodiment of the invention, an integrated circuit device comprises a memory, at least a portion of the memory filled with a pre-defined value. A receiver coupled to the memory is configured to determine if a received data packet is valid and store the valid data packet over the pre-define values in the memory location associated with the valid data packet. An erasure error correction process circuit is coupled to the receiver and the memory. The erasure error correction process circuit is configured to compare values associated with a data segment and an adjacent data segment in the memory to the pre-defined value. When the values of each data segment match the pre-defined values, the each data segment is an erroneous data segment.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings examples which are presently preferred. It should be understood, however, that the invention is not limited to the precise arrangements and instrumentalities shown. In the drawings:

Figure 1B:
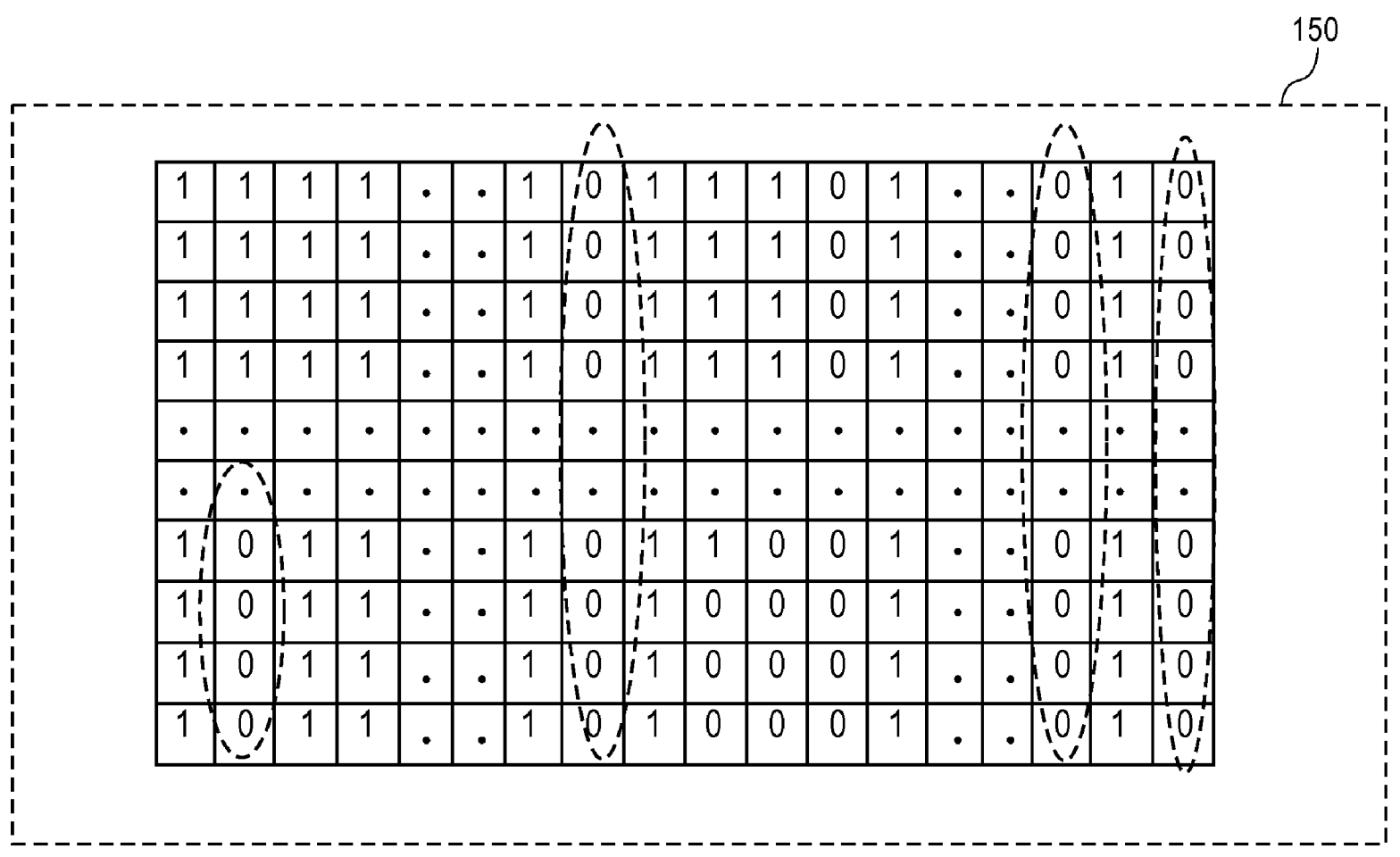

FIG. 1A and FIG. 1B illustrate an exemplary method of an error correction of the prior art;

FIG. 1C illustrates another exemplary method of an error correction of the prior art;

DETAILED DESCRIPTION

Reference will now be made in detail to the present examples of the invention illustrated in the accompanying drawings. Wherever possible, the same reference numbers will be used throughout the drawings to refer to the same or like elements.

The present invention is dedicated to disclose a method for correcting the erroneous data in a FEC frame without adding additional memory.

Figure 1A:
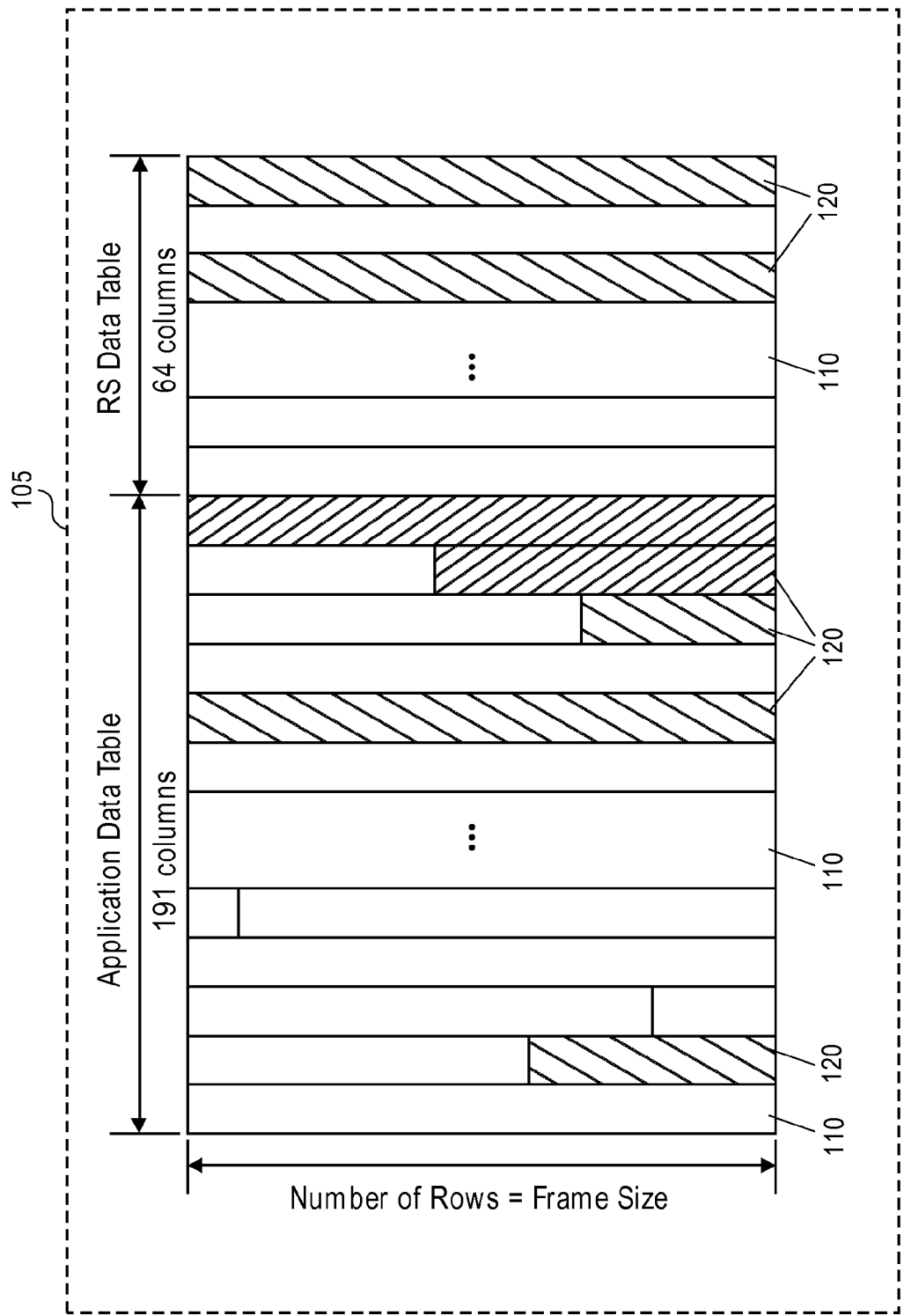
Figure 2:
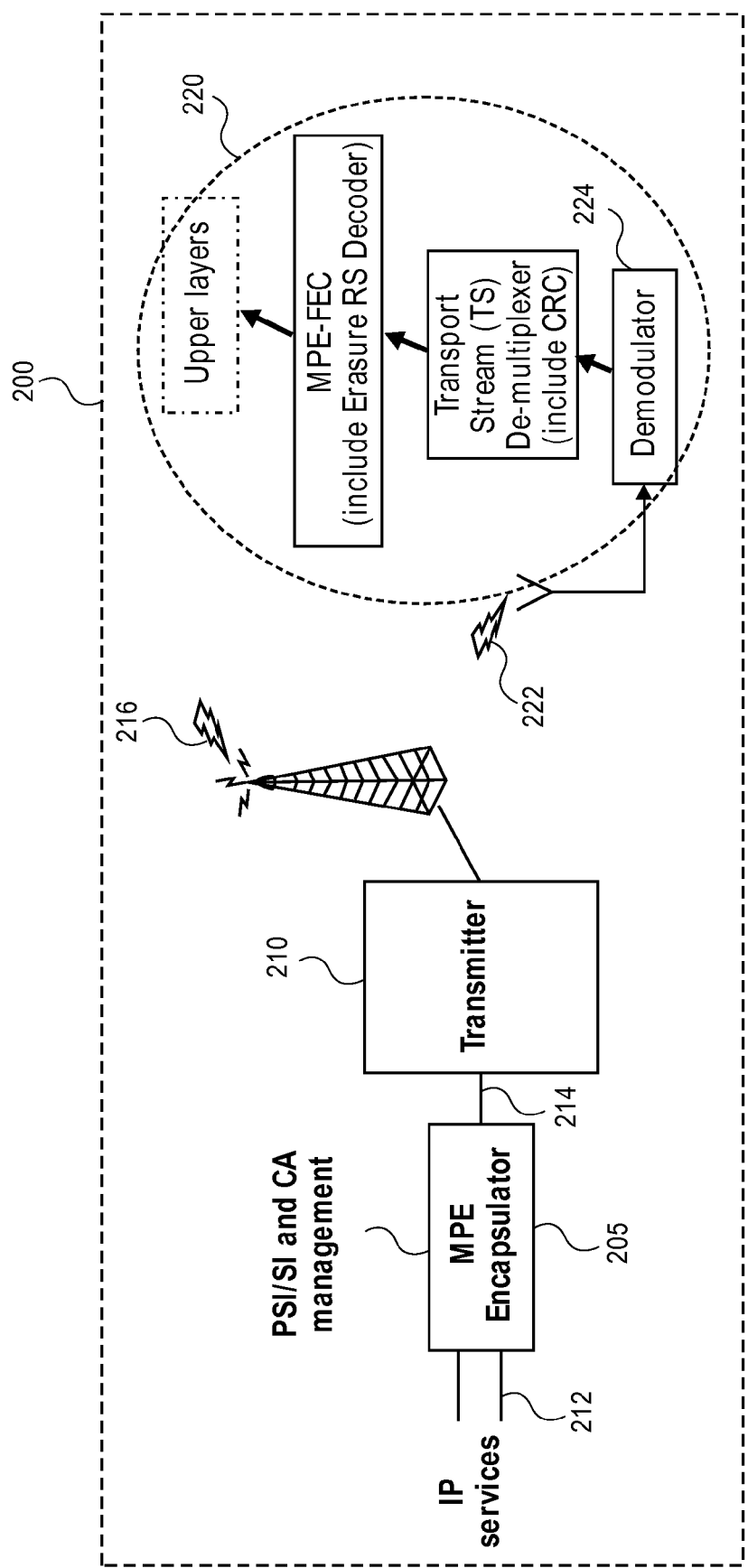
FIG. 2 illustrates a functional block diagram of the digital video broadcast system according to one embodiment of the invention.

FIG. 2 illustrates a functional block diagram of a digital video broadcast (DVB) system 200 according to one example embodiment of the invention. Referring to FIG. 2, the DVB system 200, in accordance with the DVB specifications of European Telecommunications Standards Institute (ETSI), may comprise an MPE encapsulator 205, a transmitter 210 and a receiver 220. IP services information may be sent on a communication path 212 to the MPE encapsulator 205. In one example embodiment, the IP service information comprises IP data packets. IP data packets are received and put into the MPE-FEC table, datagram by datagram. The encapsulator 205 codes the IP datagrams in accordance to a forward error correction (FEC) technique using Reed-Solomon (RS) code. After encapsulating and multiplexing (not shown), the MPE encapsulator 205 may send a transport stream (TS) 214, such as an MPEG-2 TS, to the transmitter 210. The TS 214 in this embodiment includes encapsulated IP services information and encapsulated program specific information/service information (PSI/SI). The TS 214 may be modulated in the transmitter 210 by a modulator (not shown) in accordance with DVB-H or DVB-T techniques and then be broadcast to the receiver 220 via an antenna 216. The modulated TS 214 may be received by the receiver 220 from the transmitter 210 via an antenna 222 and then be provided to a demodulator 224 to demodulate the modulated TS 214 with the same techniques (e.g., DVB-H or DVB-T). The demodulated TS 214 may then be fed to a decapsulator (not shown) to decapsulate the TS 214 into a number of IP datagrams, which is in an opposite manner as the encapsulator 205 encapsulated the IP datagrams. The IP datagrams may then be sent to terminals (e.g., a mobile phone or a portable digital assistant (PDA) etc.).

Figure 3:
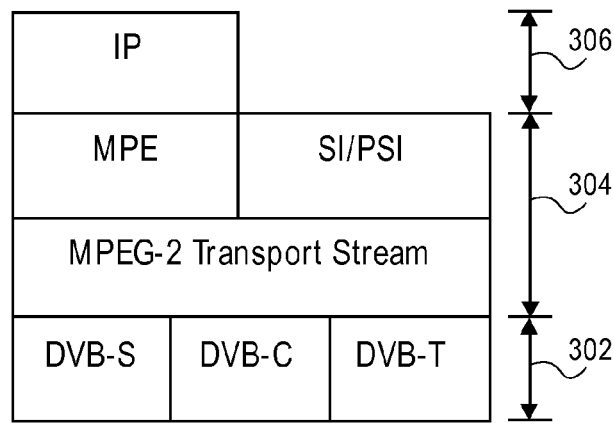
FIG. 3 illustrates an OSI protocol stack-layer for the digital video broadcasting-handheld terminal.

FIG. 3 illustrates an OSI protocol stack-layer for transmitting data packets from the external source to the terminals. The OSI protocol stack-layer includes a physical layer 302, a link layer 304 and a network layer 306. IP datagrams are encapsulated into the MPEG-2 transport streams (TS) using MPE-FEC protocol in the link layer 304. The MPEG-2 transport streams are then transmitted through the modulator and the demodulator in the physical layer 302. After decapsulating the transport streams into the IP datagrams in the link layer 304, the IP datagrams are then routed to the terminals in the network layer 306.

Figure 4:
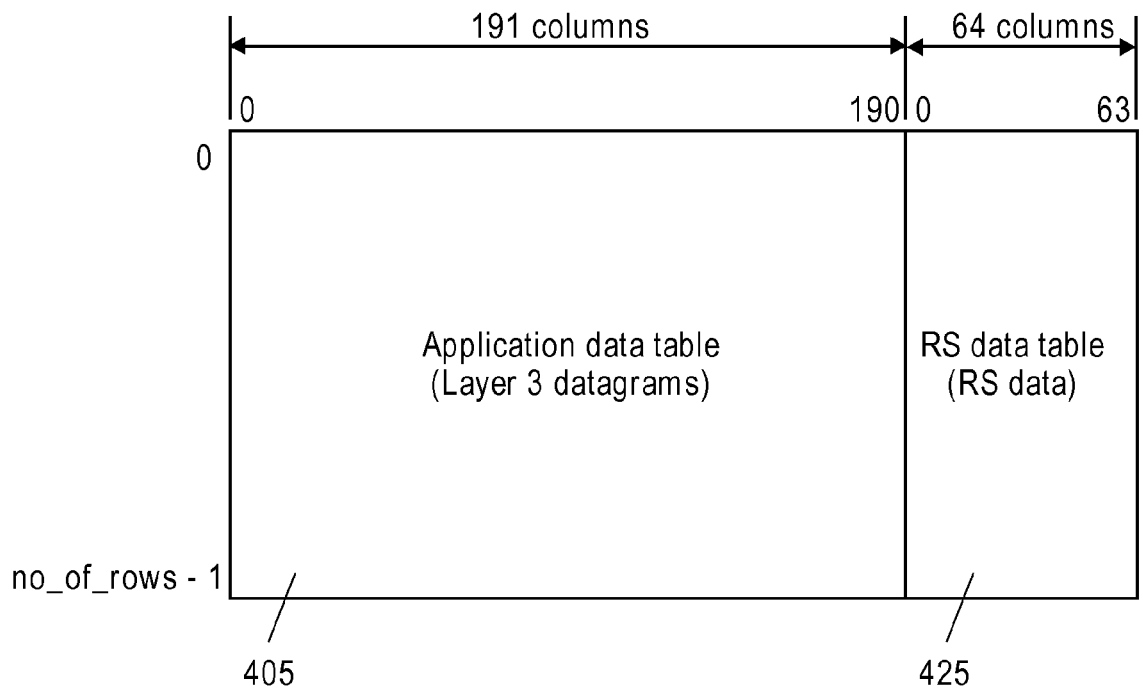
FIG. 4 illustrates a schematic block diagram of an MPE-FEC frame according to one embodiment of the invention.
Figure 5:
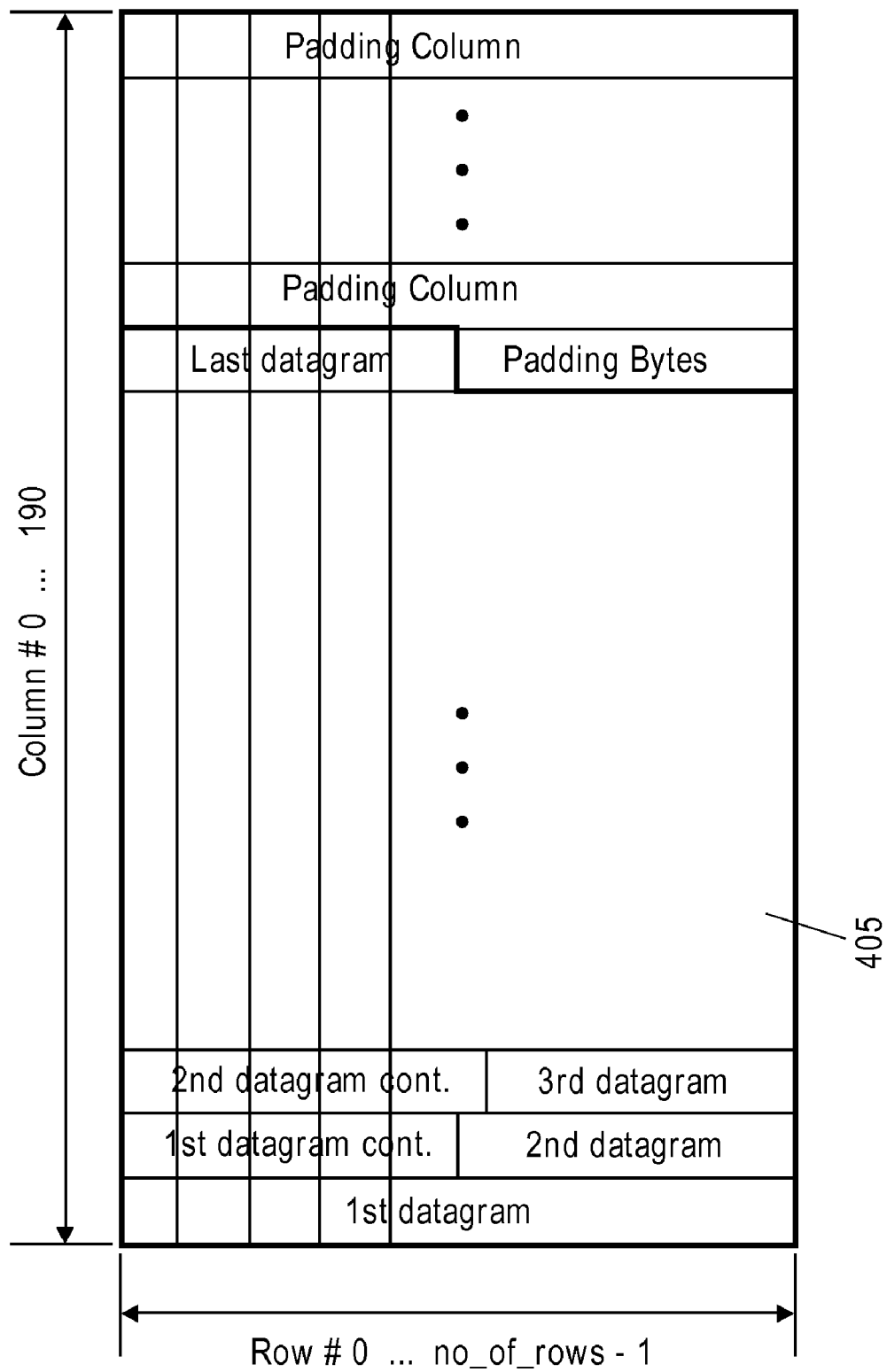
FIG. 5 and FIG. 6 illustrate schematic block diagram of an MPE-FEC frame and encapsulated MPE and FEC tables according to one embodiment of the invention.
Figure 6:
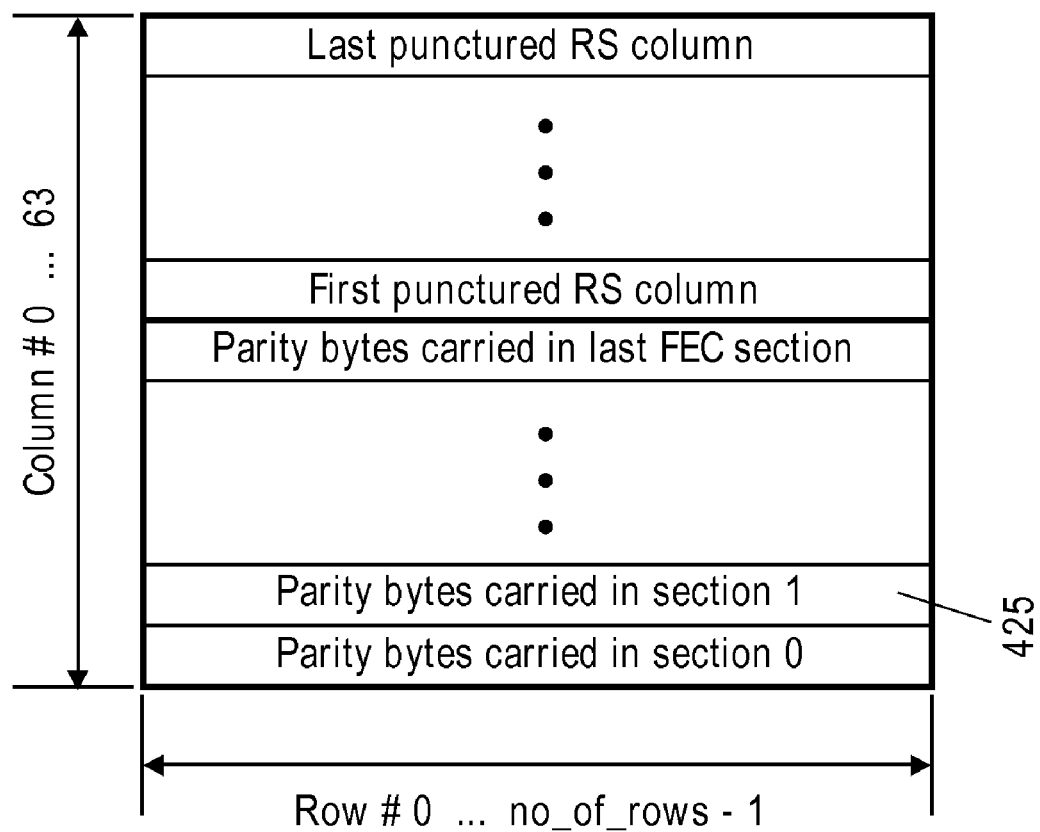

Examples of encapsulating operations are illustrated with reference to FIG. 4 through FIG. 6. In one example embodiment, the encapsulating operations are performed based on the DVB specifications standardized by the European Telecommunications Standards Institute (ETSI). The MPE-FEC frame may include an MPE table (e.g. an application data table 405) and an FEC table (e.g. an RS parity data table 425). To code the IP data packets, the encapsulator encapsulates the IP data packets column-wise into the application data table 405. As illustrated in FIG. 5, the IP datagrams are introduced one by one into the application data table 405, with the first byte of the first IP datagram in the upper left corner of the application data table 405 and going downwards to the first column. The length of the IP datagrams may vary arbitrarily from datagram to datagram, which means the IP datagrams may not end precisely at the end of each column. After the end of one datagram, the following datagram may start immediately. When all IP datagrams have entered the application data table, any unfilled byte positions may be padded with zeros to fill the application data table 405.

The MPE-FEC table is arranged as a matrix with 255 columns and a flexible number of rows as given in FIG. 5. The possible number of rows is 256, 512, 768 and 1024. In one example embodiment, the left portion of the MPE-FEC table includes the application data table 405 composed of 191 columns dedicated for IP datagrams and padding columns. While the right portion of the MPE-FEC table includes the RS parity data table 425 composed of 64 columns dedicated for parity data. With the leftmost 191 columns filled, it may be possible, row-wise for each row of the application data table 405, to calculate the 64 bytes parity data (e.g., RS data) from the 191 columns of IP datagrams and padding columns. The row-wise RS parity data associated with the application data table 405 may be arranged into columns in the RS parity table 425 as illustrated in FIG. 6.

Prior to storing the correctly received data packets in memory, the memory includes an empty MPE-FEC table (e.g., the application data table 405 and the RS parity table 425) with all its byte positions marked as "unreliable." For example, all the bytes are initially "0" or "1." Once a data packet is correctly received by verifying a CRC code or a check sum, the IP datagram may be stored at the correct byte positions in the MPE-FEC table. However, if the CRC or the check sum fails, the receiver will discard the entire data packet and flag the lost byte positions as unreliable. In other words, if the received data packet is partly correct the receiver will be able to detect it and may discard that entire data packet. As a result, each byte in the "unreliable" lost byte positions may not be changed and may remain as the initial value. For example, if the MPE-FEC table is pre-filled with "0"s, all the bytes in the unreliable byte positions of the MPE-FEC table may be kept as "0"s. From this point of view, if a specific variable which has a relatively lower probability of appearing in the data packets, or a specific variable which has apparently lower continuous probability than that of other variables is used to pre-fill the MPE-FEC table, it may be possible to detect the erroneous data packets by comparing the values of bytes in the MPE-FEC table with the value of the specific variable. For example, for a particular application (e.g., music based data packets), a value of low probable occurrence may be a data packet of all "1"s, which may make it a favorable specific variable for use in the MPE-FEC table.

Figure 7:
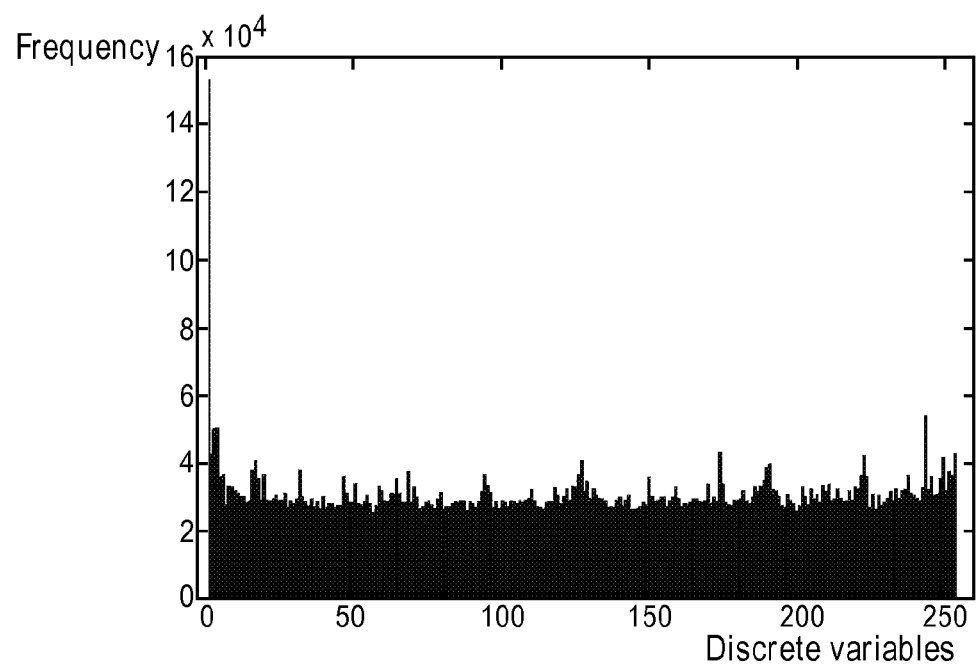
FIG. 7 illustrates a discrete probability distribution of discrete variables according to one embodiment of the invention.
Figure 8:
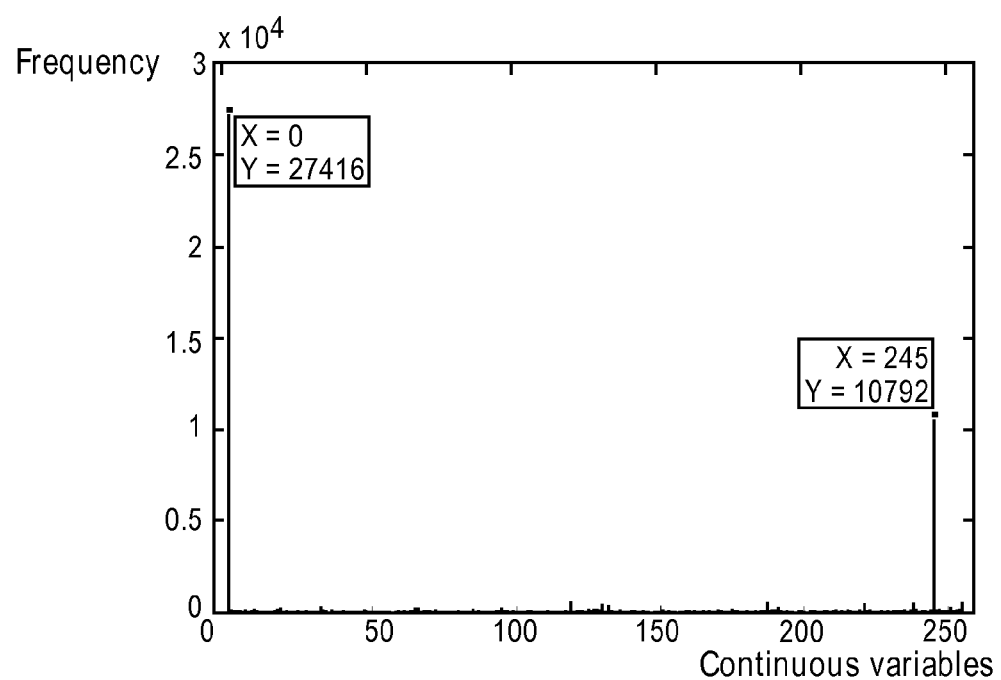
FIG. 8 illustrates a continuous probability distribution of continuous variables according to one embodiment of the invention.

From the probability distribution as illustrated in FIG. 7 and FIG. 8, the continuous probability of a random variable appearing in the received data packets is far lower than the discrete probability. As shown in FIG. 7 and FIG. 8 respectively, the discrete variable is distributed evenly but the continuous probability of a random variable is in a sharp wave, that is, variables may have the lower probability of being received continuously.

Therefore, according to one embodiment of the invention, a specific variable having a value with low continuous probability may be used to pre-fill the MPE-FEC table. In one example embodiment, the specific variable may be set as hex value FF or hex value FE. Accordingly, all byte positions of the MPE-FEC table filled with a pre-defined value are marked as unreliable before the receiver starts to receive data packets. When the receiver begins to receive data, the receiver checks the CRC code of the received data packet. The CRC code, which is used to protect all the MPE and FEC data packets, will reliably detect all erroneous data packets. After the CRC code of every FEC data packet header is checked, each received valid data packet or RS parity data may be stored in the correct byte positions in the memory that are associated with the valid data packet. If there are transmission errors, the erroneous data packets are discarded and the corresponding byte positions remain as the pre-filled value. In this way, only fully valid data packets are passed to the MPE-FEC for decoding. All byte positions within the MPE-FEC table are now marked either as reliable and filled with the correct data information, or as unreliable and filled with the pre-defined value associated with the specific variable chosen. Although for simplicity a CRC error detection scheme is illustrated herein, it can be appreciated that in various example embodiments many forms of error detection may be used, such as checksum, parity, etc.

Figure 9:
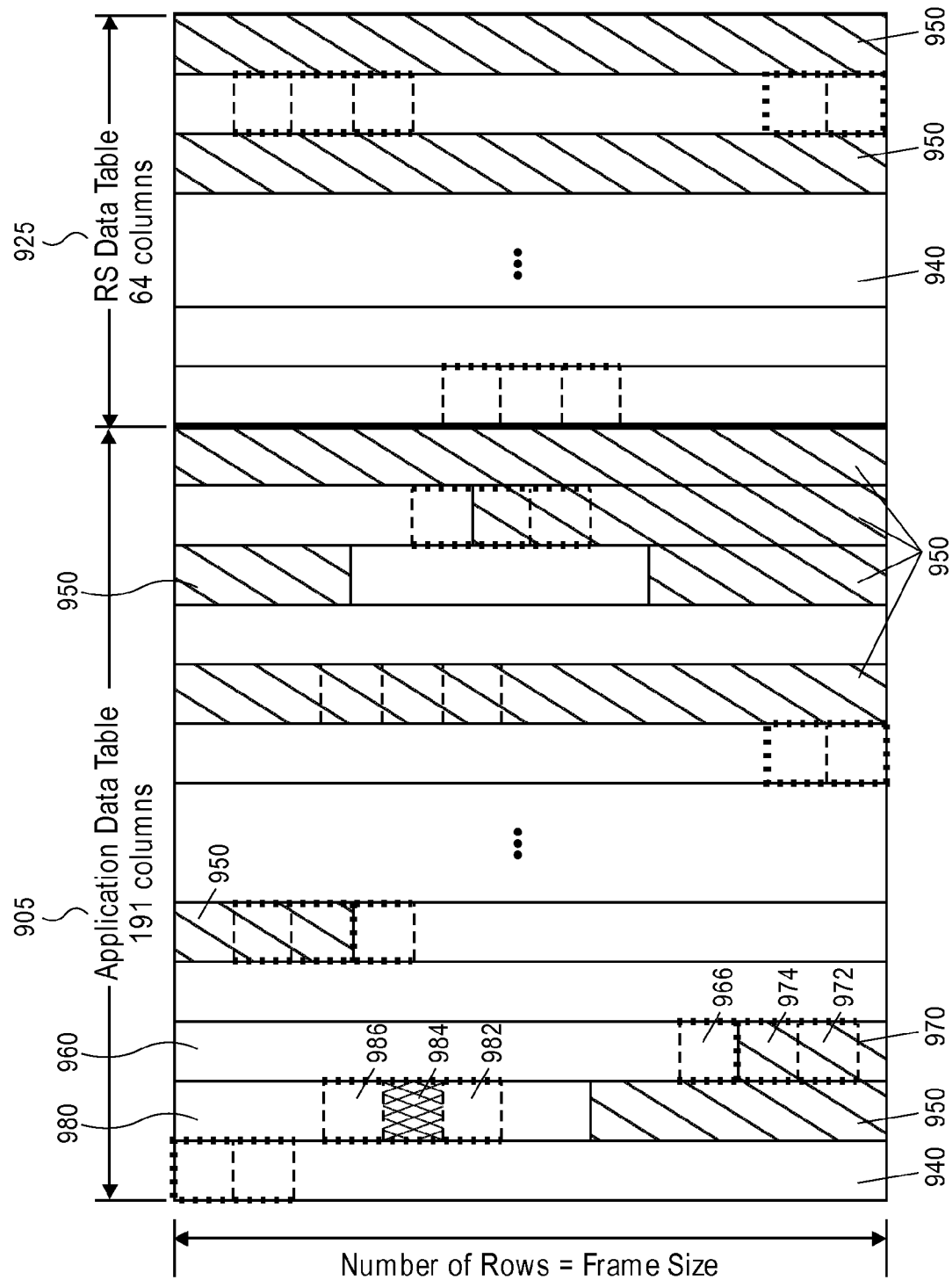
FIG. 9 illustrates an example method of an error correction according to one embodiment of the invention.

FIG. 9 illustrates an example method of an error correction according to one embodiment of the invention. In this embodiment, datagram 940 indicate correctly received data packets. Erroneous section 950 is a lost section which may be discarded by the receiver. The received valid datagram 940 are put in the correct byte positions of an application data table 905 and an RS parity table 925, while the erroneous section 950 remains the pre-filled value. Since the specific variable whose value is used to pre-fill the MPE-FEC table has relatively lower continuous probability of appearing, it may be able to detect errors by checking if the subsequent data segments are equal to the value of the specific variable. In one example embodiment, the data segment may comprise one byte. In another example embodiment, the data segment may comprise several subsequent bytes. Referring back to FIG. 9, section 970 includes a data segment 972 which may be equal to a data segment 974 which in turn may be equal to the pre-filled value initially loaded into the MPE-FEC table. Thus an erasure indicator indicative of an erasure status of the data segment is obtained. The erasure indicator may be set to indicate that the section 970, including the data segments 972 and 974, may not have been received correctly and is erroneous data. In one embodiment, based on the erasure indicator, the receiver determines all byte positions of the section 970 are lost. An erasure error correction process may then be performed on the section 970. However, if a data segment 966 is not equal to the data segment 974 and the pre-filled value, a datagram 960 including the data segment 966 may be correctly received. The erasure indicator may be reset to indicate that no erasure error correction process is performed on the datagram 960.

In another example embodiment, the unfilled byte positions of the application data table may be filled with padding columns. In the receiver, the padding columns may be marked as reliable and only used in decoding. If the received data packet is within a padding column, the RS parity data corresponding to the received data packet may be equal to zero and the erasure error correction process is not performed.

In one embodiment, a low probability event may occur, meaning a data segment of the correctly received data packets may be equal to its adjacent data segments and the pre-filled value. For example, a data segment 984 may equal to its adjacent data segments 982 and 986, and may also be equal to the pre-filled value. Accordingly, section 980 including the data segments 982, 984 and 986 may be treated as an erroneous section and, even though in this case the data is correct, it is processed using the erasure error correction process.

Figure 10:
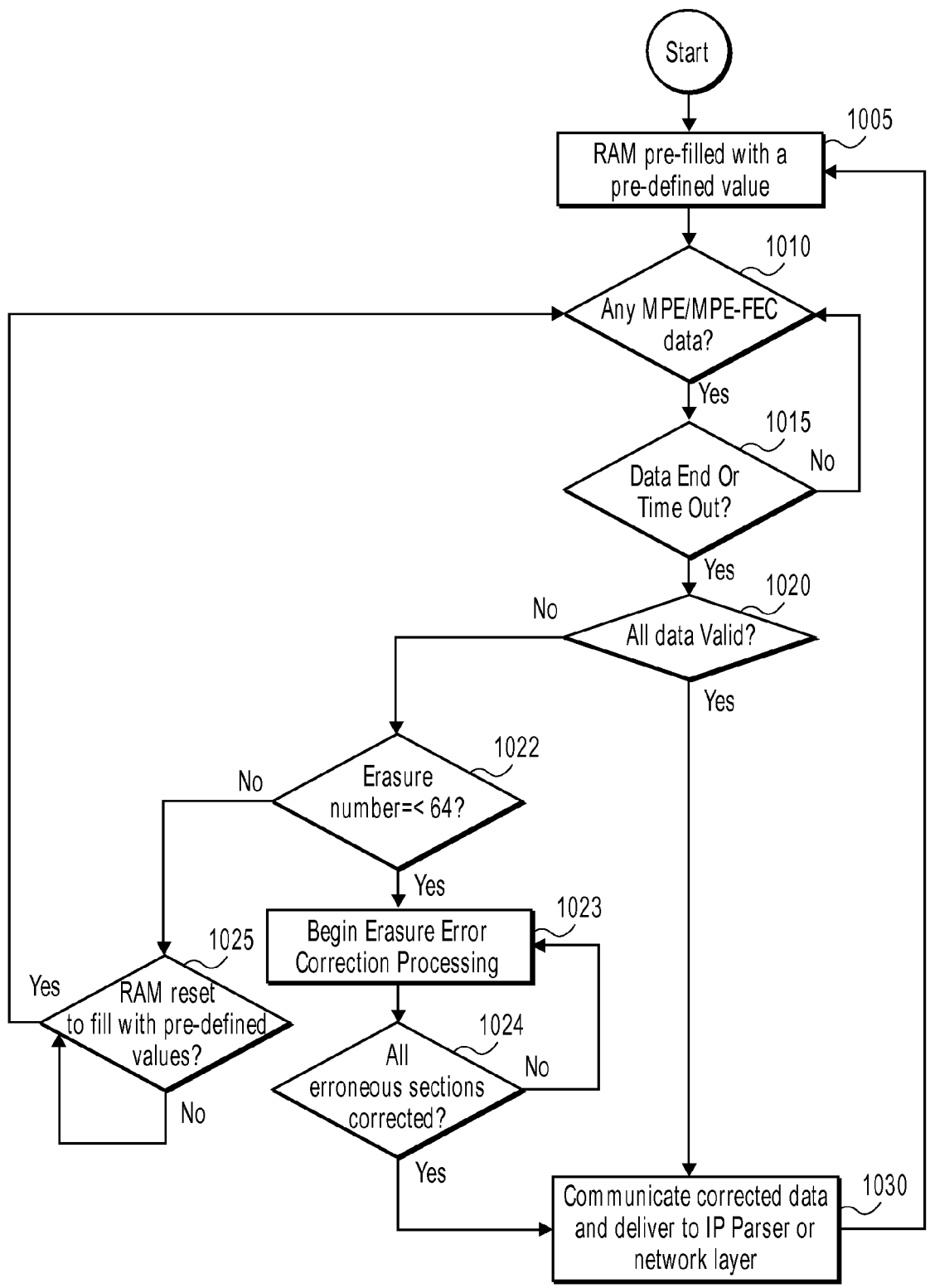
FIG. 10 illustrates an example of flow chart illustrating the operations of error correction according to one embodiment of the invention.

FIG. 10 is a flow chart illustrating the operations of error correction according to one embodiment of the invention. According to the flow chart, the MPE-FEC table of a memory is pre-filled with a pre-defined value before decoding at operation 1005. The pre-defined value associated with a specific variable has relatively lower continuous probability of appearing in the received data packet. For the transmission over the air interface, received data packets are encapsulated datagram by datagram in the MPE application data table and the FEC parity table. The last IP datagram with application data table information contains in its header a table-boundary flag, which may indicate the end of the IP datagrams within the application data table. If there are no more data to be received at operation 1010, the frame-boundary flag may be set to "1." The receiver may then detect if current MPE/FEC sections are completely received by checking the header of the current MPE/FEC section, or detect if there is time out according to the real time parameter value(s) in the header at operation 1015. When MPE/FEC sections have been completely received or if there is a time out indication, whether the received data is error free is checked at operation 1020. If there is no transmission error, i.e. the data is completely correctly received and introduced into the right place of the MPE-FEC table. If there is no transmission error, the decoder may just deliver the valid data to IP Paser or network layer at operation 1030. However, if there are transmission errors, an erasure error correction processing may be performed depending on the error correction capability of the decoder. In an example embodiment, a RS decoder is able to correct up to 64 erasures per 255-byte. If there are more than 64 unreliable byte positions in a row, the RS decoder may not be able to correct any data and may output the received bytes without error correction, or re-fill the memory with the pre-defined value associated with the specific variable at operation 1025. If there are less than 64 unreliable bytes in a row, the decoder may correct all the erroneous sections at operation 1023 and 1024. After all the erroneous sections are corrected, the corrected data is delivered to IP Parser or Network Layer at operation 1030. After which, the memory may be pre-filled with the pre-defined value of the specific variable and start to receive new data packets according to operation 1005.

Figure 11:
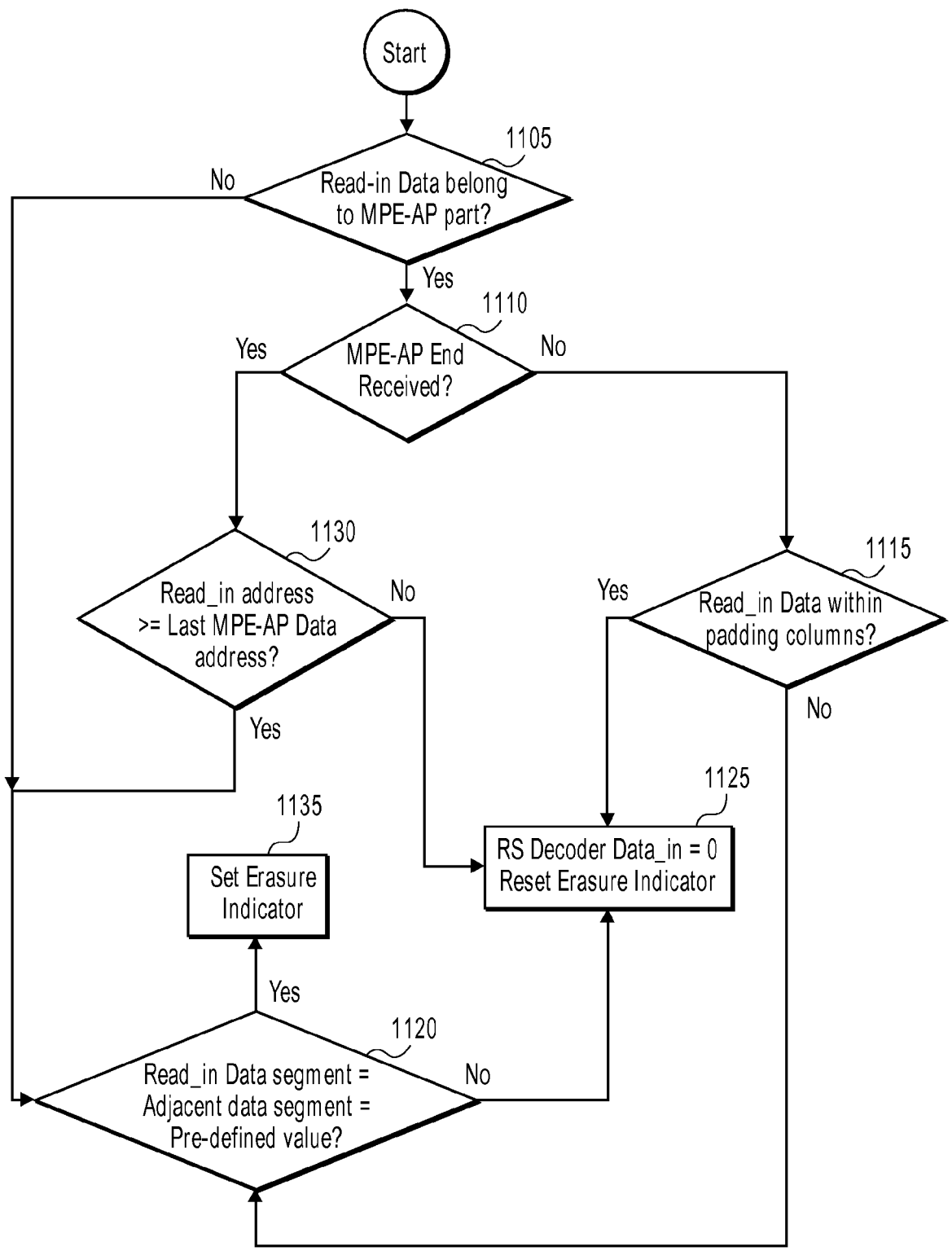
FIG. 11 illustrates an example of flow chart illustrating the operations of erasure error correction process according to one embodiment of the invention.

FIG. 11 is a flow chart illustrating the operations of an erasure error correction process according to one embodiment of the invention. In this example embodiment, if the data segment to be compared belongs to an application data table at operation 1105 and no boundary flag carried in the header of the current datagram is set to indicate that this is the last datagram within the current MPE-FEC frame at operation 1110, the adjacent data segments are compared with the data segment to be compared and the pre-filled value, respectively. If both the adjacent data segments and data segment to be compared are equal to the pre-filled value at operation 1120, the data segments undergo the erasure error correction process at operation 1135. However, if the data segment to be compared is within a padding column at operation 1115, the RS parity data corresponding to that data segment may be equal to 0, thus the erasure indicator is reset to indicate that no erasure error correction process is performed at operation 1125. When the boundary flag indicates that the current datagram is the last one at operation 1110, the comparison process may be executed based on checking if the current read address is within the last datagram at operation 1130. If both the adjacent data segments equal to the pre-filled value at operation 1120, the data segments may undergo the erasure error correction process. In an example embodiment, the data segment to be compared with its adjacent data segment and the pre-filled value may comprise 'n' successive bytes where 'n' may be 1 or 2 or other positive numbers.

Figure 12:
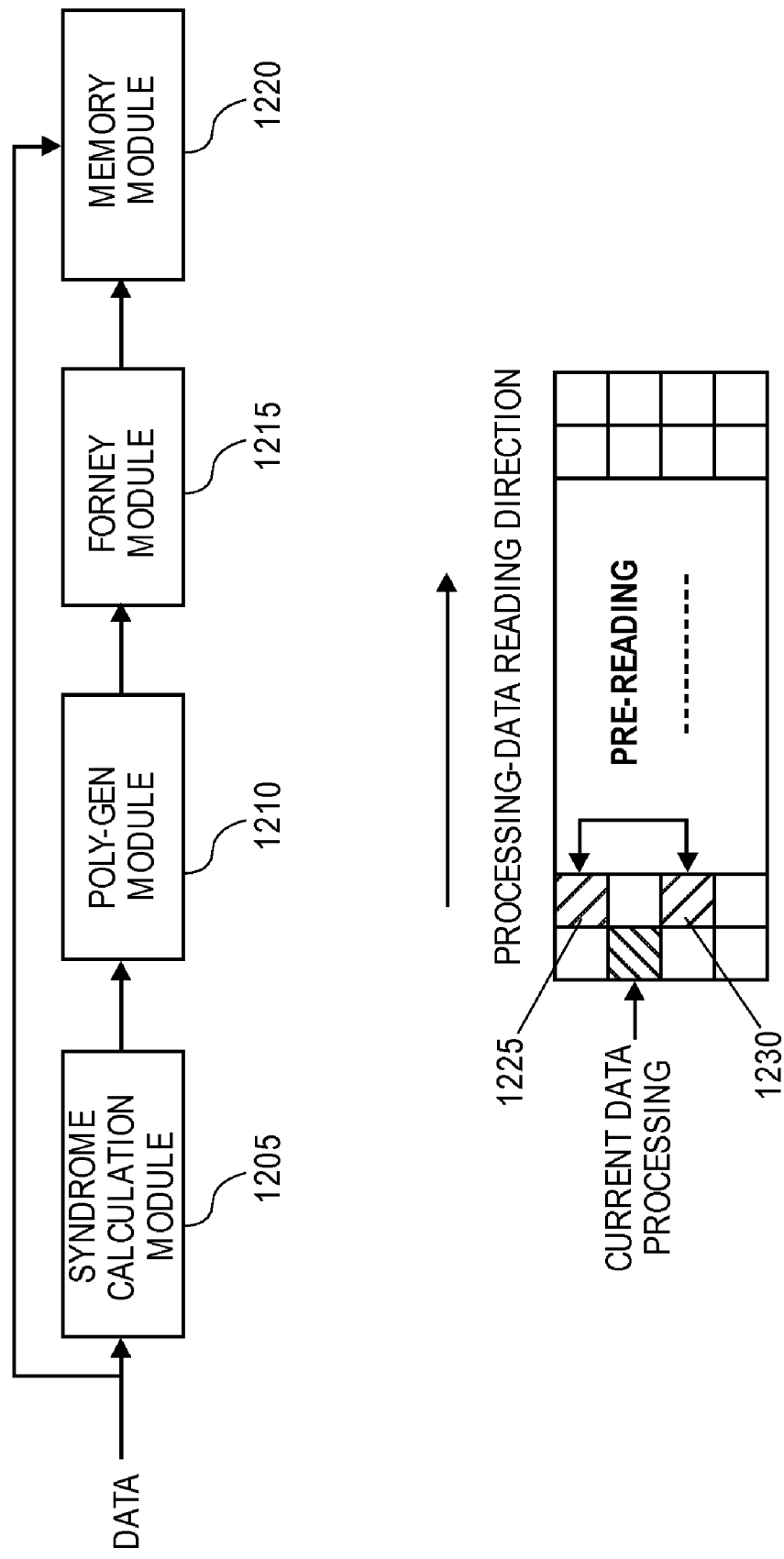
FIG. 12 illustrates a structure of an Erasure RS decoder according to one embodiment of the invention.

FIG. 12 illustrates a structure of an erasure RS (Reed-Solomon) decoder according to one embodiment of the invention. As shown in FIG. 12, the decoder may comprise a syndrome 1205, a poly-gen 1210, a Forney module 1215 and a memory module 1220. The first operation in the erasure RS decoding is to calculate the syndrome and syndrome polynomial, which are used to correct correctable errors. The poly-gen module 1210 may be used to generate an error locator which passes the error position to the decoder. The Forney module 1215 may compute the error values and the memory module 1220 may be used to buffer the received data packets in accordance to the latency of the components of the decoder. In one example embodiment, in order to reduce the time used for deciding the erasure error correction process, the value of a first adjacent data segment 1225 and a second adjacent data segment 1230 may be read prior to performing the comparison based on the latency of the components or the processing delay.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

What is claimed is:

1. A method for erasure error correction process, the method comprising:
    pre-filling at least a portion of memory with a pre-defined value; and
    comparing values associated with a data segment and an adjacent data segment in the memory to the pre-define value, wherein each data segment having values matching the pre-defined value is an erroneous data segment, and wherein the method further comprises:
    configuring the memory to have an application data table and a parity data table;
    filling unused byte locations of the application data table with padding columns;
    setting an erasure indicator for each erroneous data segment to indicate correction is required; and
    resetting the erasure indicator when the data segment being compared with its adjacent data segment and the pre-defined value is within the padding column of the application data table.

2. The method of claim 1, further comprising determining a received packet is valid and storing the valid received packet over the pre-defined values in the memory location associated with the valid received packet.

3. The method of claim 1, including correcting each erroneous data segment using an erasure decoder.

4. The method of claim 3, wherein the correcting includes:
    calculating a syndrome and a syndrome polynomial to correct correctable errors;
    generating an error locator to pass the error position to the decoder; and
    using a Forney computation to determine error values associated with the erroneous data.

5. The method of claim 1, including determining the pre-defined value based on a low continuous probability.

6. The method of claim 1, wherein the data segment and its adjacent data segments are 'n' successive bytes where 'n' is a positive number.

7. The method of claim 1, further comprising determining a received packet is valid, wherein the determining the received packet is valid includes validating each packet using at least one of a cyclic redundancy check or a check sum.

8. An integrated circuit comprising:
    a receiver coupled to a memory and configured to pre-fill at least a portion of the memory with a pre-defined value; and
    an erasure decoder, coupled to the receiver and the memory, configured to compare values associated with a data segment and an adjacent data segment in the memory to the pre-defined value, wherein each data segment that includes values matching the pre-defined value is an erroneous data segment,
    wherein the memory is configured to include an application data table and a parity data table, and the receiver is configured to fill unused byte locations of the application data table with padding columns, and
    wherein the receiver is configured to set an erasure indicator for each erroneous data segment to indicate correction is required, and reset the erasure indicator when the data segment being compared with its adjacent data segment and the pre-defined value is within the padding column of the application data table.

9. The integrated circuit of the claim 8, wherein the receiver is further configured to determine if a received data packet is valid and to store the valid data packet over the pre-define value in the memory location associated with the valid data packet.

10. The integrated circuit of the claim 8, wherein the erasure decoder is further configured to use an erasure error correction process to correct each erroneous data segment.

11. The integrated circuit of the claim 8, including wherein the receiver is configured to determine the pre-defined value based on a low continuous probability.

12. The integrated circuit of the claim 8, wherein the data segment and its adjacent data segments are configured to comprise 'n' successive bytes where 'n' is a positive number.

13. The integrated circuit of the claim 8, wherein the receiver is further configured to determine if a received data packet is valid, and wherein the receiver is configured to determine if the received data packet is valid using at least one of a cyclic redundancy check or a check sum.

14. The integrated circuit of the claim 8, wherein the erasure decoder includes:
    a syndrome module to calculate the syndrome and syndrome polynomial, which are used to correct correctable errors;
    a poly-gen to generate an error locator which passes the error position to the erasure decoder;
    a Forney module to compute error values;
    a memory module to buffer data in accordance to a latency of components associated with the erasure decoder.

* * * * *